(12) United States Patent
Sato et al.

(10) Patent No.: US 8,605,476 B2
(45) Date of Patent: Dec. 10, 2013

(54) SEMICONDUCTOR DEVICE HAVING HIERARCHICAL STRUCTURED BIT LINE

(75) Inventors: Takenori Sato, Tokyo (JP); Kazuhiko Kajigaya, Tokyo (JP); Yoshimitsu Yanagawa, Tokyo (JP); Tomonori Sekiguchi, Tokyo (JP); Akira Kotabe, Tokyo (JP); Satoru Akiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 229 days.

(21) Appl. No.: 12/926,693

(22) Filed: Dec. 3, 2010

(65) Prior Publication Data
US 2011/0134678 A1    Jun. 9, 2011

(30) Foreign Application Priority Data

Dec. 4, 2009  (JP) ................................. 2009-277059

(51) Int. Cl.
*G11C 5/06*  (2006.01)

(52) U.S. Cl.
USPC ..... 365/63; 365/51; 365/230.03; 365/230.04; 365/230.06

(58) Field of Classification Search
USPC ................................. 365/51, 63, 203, 230.03
See application file for complete search history.

(56) References Cited

U.S. PATENT DOCUMENTS

| 5,732,010 A | * | 3/1998 | Takashima et al. ............. 365/63 |
| 5,757,692 A | * | 5/1998 | Suh ................................ 365/149 |
| 5,946,254 A |   | 8/1999 | Tsuchida |
| 6,333,866 B1 | * | 12/2001 | Ogata .............................. 365/63 |

FOREIGN PATENT DOCUMENTS

| JP | 8-87880 A | 4/1996 |
| JP | 11-163292 A | 6/1999 |
| JP | 2000-114491 A | 4/2000 |

* cited by examiner

*Primary Examiner* — Thao Bui
(74) *Attorney, Agent, or Firm* — McGinn IP Law Group, PLLC (57) ABSTRACT

A sense operation with respect to simultaneously-accessed two memory cells is performed by time division by using two sense amplifiers, and thereafter restore operations are performed simultaneously. With this arrangement, it is not necessary to provide switches in the middle of global bit lines, and no problem occurs when performing the restore operation by time division. Further, because a parasitic CR model of a first sense amplifier and that of a second sense amplifier become mutually the same, high sensitivity can be maintained.

20 Claims, 6 Drawing Sheets

SEMICONDUCTOR DEVICE HAVING HIERARCHICAL STRUCTURED BIT LINE

CROSS-REFERENCE TO RELATED APPLICATIONS

This application is based upon and claims the benefit of priority from Japanese Patent Application No. 2009-277059, filed Dec. 04, 2009; the entire contents of which are incorporated herein by reference.

BACKGROUND OF THE INVENTION

1. Field of the Invention

The present invention relates to a semiconductor device, and more particularly relates to a semiconductor device in which bit lines have a hierarchical structure.

2. Description of Related Art

Among semiconductor devices represented by DRAM (Dynamic Random Access Memory), there are devices in which bit lines thereof are hierarchized into local bit lines and global bit lines (see Japanese Patent Application Laid-open Nos. 2000-114491, H11-163292, and H8-87880). The local bit lines are low-order bit lines and are connected to memory cells. Meanwhile, the global bit lines are high-order bit lines and are connected to sense amplifiers. When bit lines are hierarchized, the number of memory cells allocated to one sense amplifier can be increased while shortening a wiring length of local bit lines having a relatively high electric resistance.

FIG. 4 in Japanese Patent Application Laid-open No. 2000-114491 shows a semiconductor device in which sense amplifiers are respectively provided at both ends of a pair of global bit lines, and accessed two memory cells are connected to mutually different sense amplifiers by ON/OFF controlling switches provided in the middle of global bit lines. With this arrangement, data of the two memory cells are simultaneously amplified by the mutually different sense amplifiers, and are simultaneously restored.

FIG. 18 in Japanese Patent Application Laid-open No. H11-163292 shows a semiconductor device, in which bit lines thereof are not hierarchized, but has sense amplifiers respectively provided at both ends of a first bit line that is disconnected in the middle and a second bit line that can be short-circuited via switches. Accessed two memory cells are connected to mutually different sense amplifiers by ON/OFF controlling switches provided in the middle of the second bit line. With this arrangement, data of the two memory cells are simultaneously amplified by the mutually different sense amplifiers, and are sequentially restored.

FIG. 1 in Japanese Patent Application Laid-open No. H8-87880 shows a semiconductor device having a sense amplifier provided at one end of a pair of global bit lines, and accessed two memory cells are amplified by time division. With this arrangement, data of the two memory cells are amplified by the same sense amplifier by time division, and are restored by time division.

However, according to the semiconductor device described in Japanese Patent Application Laid-open No. 2000-114491, because switches are provided in the middle of global bit lines, a parasitic capacitance of the global bit lines increase due to an ON resistance of the switches. Further, because positions of the switches which are turned ON change depending on positions of memory cells to be accessed, a parasitic capacitance connected to one sense amplifier and a parasitic capacitance connected to the other sense amplifier do not necessarily match at a time of a sense operation, and also change at each access. Therefore, an operation margin of the sense amplifier decreases.

According to the semiconductor device described in Japanese Patent Application Laid-open No. H11-163292, because switches are provided in the middle of bit lines, a parasitic capacitance of the bit lines also increases due to an ON resistance of the switches. Further, among the accessed two memory cells, a sense operation and a restore operation are performed simultaneously in one memory cell, but these operations are performed at different timings in the other memory cell. Therefore, a timing margin of control is small.

According to the semiconductor device described in Japanese Patent Application Laid-open No. H8-87880, among the accessed two memory cells, a parasitic capacitance of a global bit line at the time of reading data from one memory cell is different from that of a global bit line at the time of reading data from the other memory cell. Therefore, an operation margin of the sense amplifier decreases. Further, because a restore operation is performed by time division, a potential of a bit line connected to a memory cell to be restored next changes and a restore voltage changes, due to a variation of a potential of a bit line at the time of performing a first restore operation. Furthermore, because restore timings of the two memory cells are different, an apparent information-holding capacity of the memory cell previously restored decreases.

SUMMARY

In one embodiment, there is provided a semiconductor device comprising: first and second global bit lines; a plurality of first local bit lines respectively connected to the first global bit line via first hierarchical switches; a plurality of second local bit lines respectively connected to the second global bit line via second hierarchical switches; a plurality of first memory cells allocated to each of the first local bit lines; a plurality of second memory cells allocated to each of the second local bit lines; a plurality of word lines that connect the first and second memory cells to corresponding first and second local bit lines, respectively; a first sense amplifier connected to the first and second global bit lines via first and second sense switches, respectively; a second sense amplifier connected to the first and second global bit lines via third and fourth sense switches, respectively; and a control circuit, wherein the control circuit activates one of the word lines to simultaneously connect selected ones of the first and second memory cells to corresponding first and second local bit lines, the control circuit brings one of the first hierarchical switches and the first and second sense switches into an electrically conductive state, said one of the first hierarchical switches being provided between the corresponding first local bit line connected to the selected first memory cell and the first global bit line, thereby transferring data stored in the selected first memory cell to the first sense amplifier, the control circuit brings the first hierarchical switch into an electrically nonconductive state, and thereafter activates the first sense amplifier, thereby amplifying data stored in the selected first memory cell, the control circuit brings one of the second hierarchical switches and the third and fourth sense switches into an electrically conductive state, said one of the second hierarchical switches being provided between the corresponding second local bit line connected to the selected second memory cell and the second global bit line, thereby transferring data stored in the selected second memory cell to the second sense amplifier, the control circuit brings the second hierarchical switch into an electrically nonconductive state, and thereafter activates the second sense amplifier, thereby amplifying data stored in the selected second memory cell, and the control circuit brings the first and fourth sense switches and the first and second hierarchical switches into an electrically conductive state, and also brings the second and third sense switches into an electrically nonconductive state, thereby simultaneously restoring data amplified by the first and second sense amplifiers into the selected first and second memory cells, respectively.

In another embodiment, there is provided a semiconductor device comprising: first and second global bit lines; first to fourth sense switches; a first sense amplifier connected to one ends of the first and second global bit lines via the first and second sense switches, respectively; a second sense amplifier connected to other ends of the first and second global bit lines via the third and fourth sense switches, respectively; a plurality of first local bit lines respectively connected to the first global bit line via first hierarchical switches; a plurality of second local bit lines respectively connected to the second global bit line via second hierarchical switches; a plurality of first memory cells respectively allocated to the first local bit lines; a plurality of second memory cells respectively allocated to the second local bit lines; and a control circuit that controls at least the first to fourth sense switches mutually independently.

According to the present invention, because switches that disconnect global bit lines are not provided in the middle of the global bit lines, a parasitic capacitance of the global bit lines can be reduced. Further, because an operation condition of the first sense amplifier is equal to that of the second sense amplifier, operation margins of the sense amplifiers can be sufficiently secured. Furthermore, because the restore operation using the first sense amplifier and the restore operation using the second sense amplifier can be performed simultaneously, various problems that can occur at the time of performing a restore operation by time division do not occur.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

A representative example of a technical concept for solving the problem of the present invention is described below. It is needless to mention that the contents that the present application is to claim for patent are not limited to the following technical concept, but to the description of the appended claims. That is, the present invention has a technical concept of performing a sense operation to simultaneously-accessed two memory cells by time division by using two sense amplifiers, and thereafter simultaneously performing restore operations from the two sense amplifiers to corresponding two memory cells. With this arrangement, switches are not necessary in the middle of the global bit lines, and no problem occurs when performing a restore operation by time division. Because a parasitic CR model of a first sense amplifier and that of a second sense amplifier become mutually the same, high sensitivity can be maintained.

Preferred embodiments of the present invention will be explained below in detail with reference to the accompanying drawings.

Figure 1:
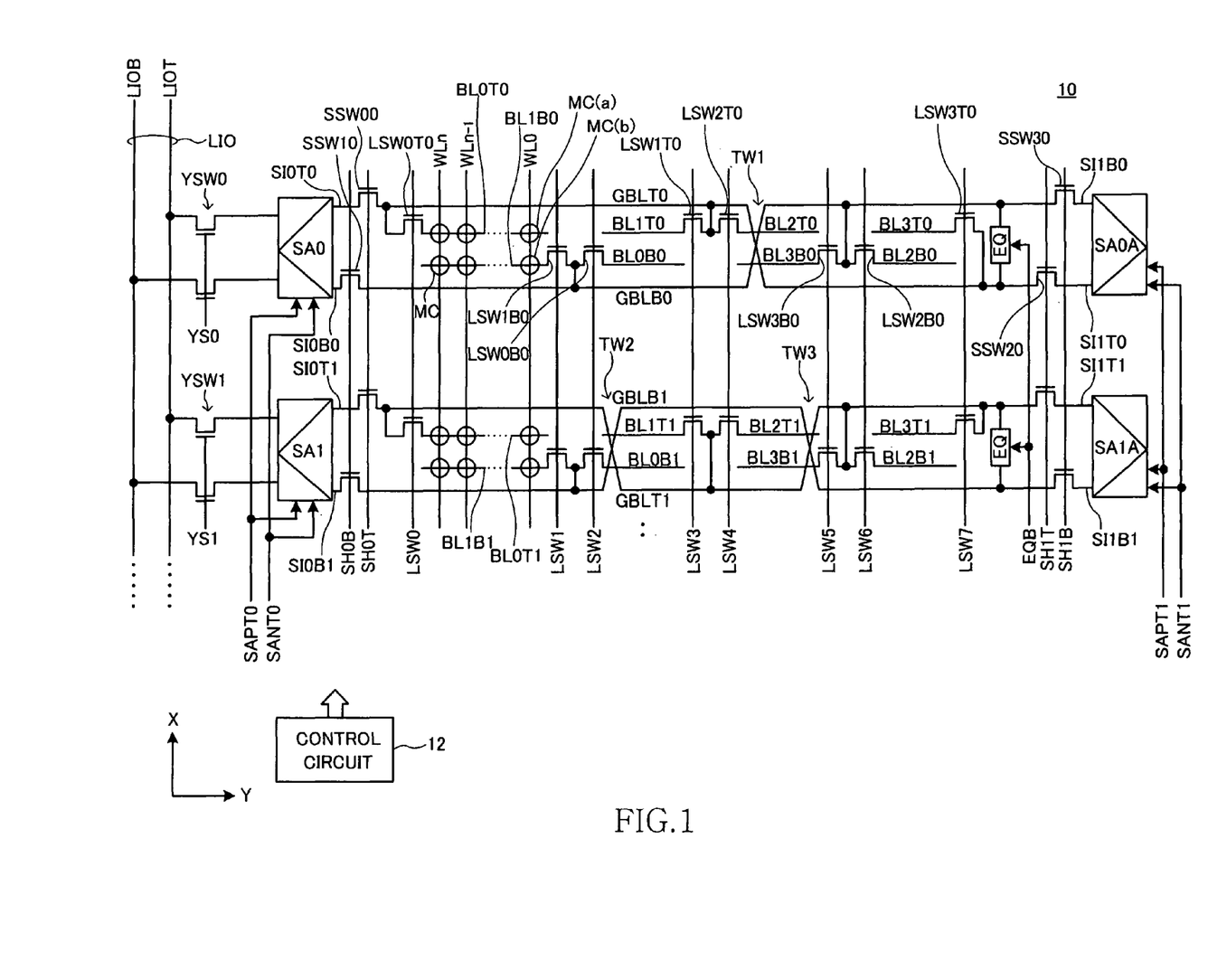
FIG. 1 is a circuit diagram showing a main part of a semiconductor device 10 according to a first embodiment of the present invention.

FIG. 1 is a circuit diagram showing a main part of a semiconductor device 10 according to a first embodiment of the present invention.

As shown in FIG. 1, the semiconductor device 10 according to the first embodiment is a semiconductor memory having hierarchized bit lines, and is configured to have two sense amplifiers connected to a pair of global bit lines as high-order bit lines. More specifically, the semiconductor device 10 according to the first embodiment includes a pair of global bit lines GBLTi and GBLBi (i=0, 1, 2, . . . ) extended in a Y direction, a sense amplifier SAi provided at one end of the pair of global bit lines GBLTi and GBLBi, and a sense amplifier SAiA provided at the other end of the pair of global bit lines GBLTi and GBLBi. Circuit formats of the sense amplifiers SAi and SAiA are not particularly limited, and a flip-flop circuit can be used, for example. The pair of global bit lines GBLTi and GBLBi have a so-called folded structure.

A sense switch SSW0$i$ (first sense switch) is connected between one end of the global bit line GBLTi and one input/output node SI0Ti of the sense amplifier SAi, and a sense switch SSW1$i$ (second sense switch) is connected between one end of the global bit line GBLBi and the other input/output node SI0Bi of the sense amplifier SAi. Similarly, a sense switch SSW2$i$ (third sense switch) is connected between the other end of the global bit line GBLTi and one input/output node SI1Ti of the sense amplifier SAiA, and a sense switch SSW3$i$ (fourth sense switch) is connected between the other end of the global bit line GBLBi and the other input/output node SI1Bi of the sense amplifier SAiA. The sense switches SSW0$i$ to SSW3$i$ are configured by an N-channel MOS transistor, and connection signals SH0T, SH0B, SH1T, and SH1B are respectively supplied to gate electrodes of these sense switches. Electric conduction and nonconduction of the four sense switches SSW0$i$ to SSW3$i$ can be mutually independently controlled. CMOS switches can be also used for the sense switches.

Local bit lines as low-order bit lines are connected to global bit lines as high-order bit lines via hierarchical switches. In the first embodiment, four local bit lines are allocated to one global bit line. These four local bit lines have mutually equal wiring lengths. Specifically, local bit lines BL0Ti, BL1Ti, BL2Ti, and BL3Ti are allocated to the global bit line GBLTi. Hierarchical switches LSW0Ti to LSW3Ti (first hierarchical switches) are respectively connected between the local bit lines BL0Ti to BL3Ti and the global bit line GBLTi. Similarly, local bit lines BL0Bi, BL1Bi, BL2Bi, and BL3Bi are allocated to the global bit line GBLBi. Hierarchical switches LSW0Bi to LSW3Bi (second hierarchical switches) are respectively connected between the local bit lines BL0Bi to BL3Bi and the global bit line GBLBi. The hierarchical switches LSW0Ti to LSW3Ti and LSW0Bi to LSW3Bi are configured by an N-channel MOS transistor, and corresponding connection signals LSW0 to LSW7 are supplied respectively to gate electrodes of these hierarchical switches. CMOS switches can be also used for the hierarchical switches.

As shown in FIG. 1, the local bit lines BL0Ti and BL1Bi intersect word lines WL0 to WLn extended in an X direction, and memory cells MC are arranged at intersections. Similarly, the local bit lines BL1Ti and BL0Bi intersect same word lines (not shown), the local bit lines BL2Ti and BL3Bi intersect same word lines (not shown), and the local bit lines BL3Ti and BL2Bi intersect same word lines (not shown).

An equalize circuit EQ is connected to the global bit lines GBLTi and GBLBi forming a pair. When an equalize signal EQB is activated, the global bit lines GBLTi and GBLBi are equalized at a predetermined potential. An equalize operation is also called "precharge".

Further, the sense amplifier SAi is connected to the local I/O line LIO via a column switch YSWi. The local I/O line LIO is a complementary wiring including local I/O lines LIOT and LIOB. When any one of column switches YSWi is in a conductive state, data of the global bit line GBLTi amplified by the sense amplifier SAi is transferred to the local I/O line LIOT, and data of the global bit line GBLBi amplified by the sense amplifier SAi is transferred to the local I/O line LIOB. The column switches YSWi are all configured by N-channel MOS transistors, and column selection signals YSi are supplied to gate electrodes of the column switches YSWi. The column switches can be also in a CMOS structure.

Activation signals of the connection signals SH0T, SH0B, SH1T, SH1B, and LSW0 to LSW7, the column selection signals YSi, and word lines WL are generated by a control circuit 12 shown in FIG. 1. That is, the control circuit 12 is a circuit block including a row decoder, a column decoder, and a control logic.

As shown in FIG. 1, the global bit lines GBLTi and GBLBi forming a pair have twist parts in which positions in the X direction are replaced at one or two positions. Specifically, a pair of global bit lines at even-order positions have one twist part TW1. The local bit lines BL0Ti, BL1Bi, BL1Ti, and BL0Bi are arranged between the twist part TW1 and the sense amplifier SAi, and the local bit lines BL2Ti, BL3Bi, BL3Ti, and BL2Bi are arranged between the twist part TW1 and the sense amplifier SAiA. On the other hand, a pair of global bit lines at odd-order positions has two twist parts TW2 and TW3. The local bit lines BL0Ti and BL1Bi are arranged between the twist part TW2 and the sense amplifier SAi. The local bit lines BL1Ti, BL0Bi, BL2Ti, and BL3Bi are arranged between the twist parts TW2 and TW3. The local bit lines BL3Ti and BL2Bi are arranged between the twist part TW3 and the sense amplifier SAiA.

Figure 2:
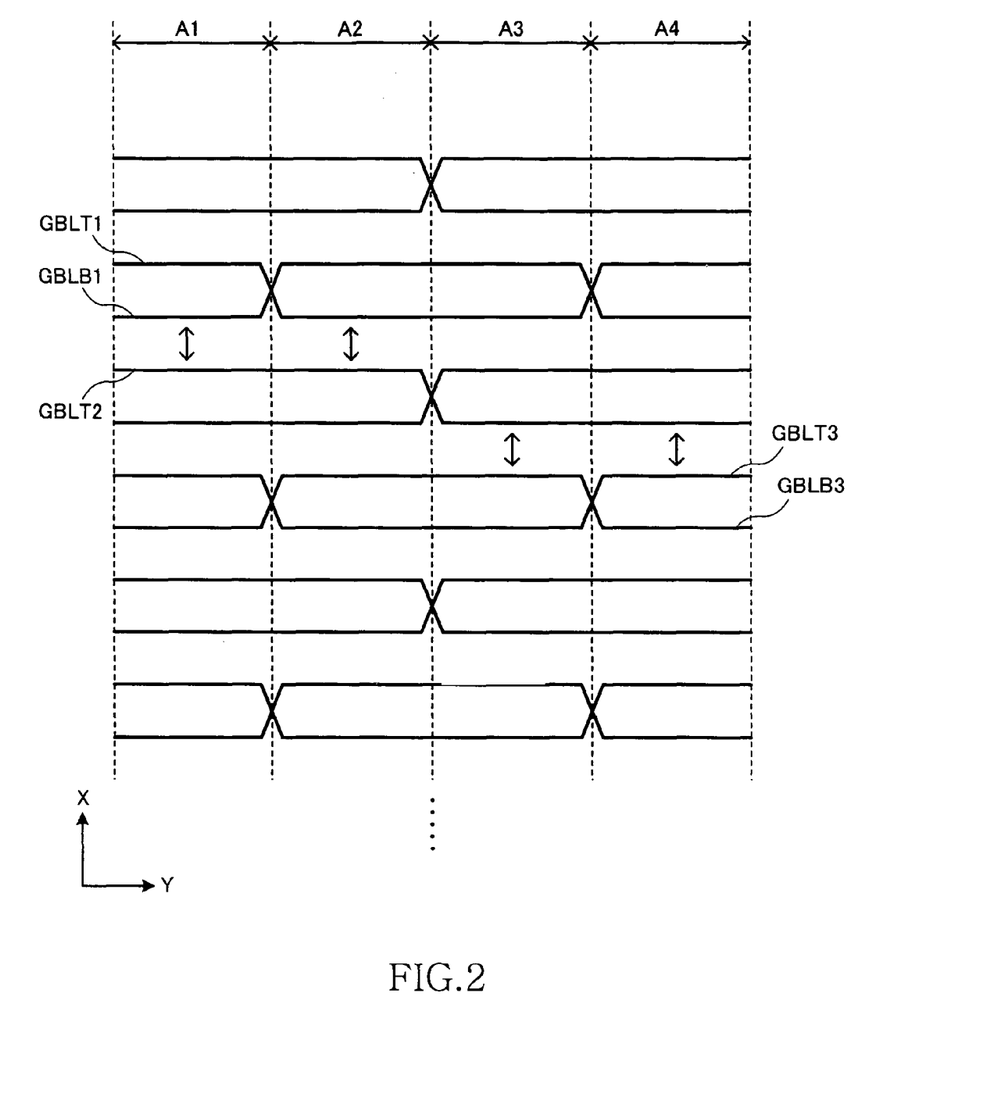
FIG. 2 is a schematic view for explaining a twist structure of global bit lines.

As a result, a twist structure of the global bit lines becomes as shown in FIG. 2. Each global bit line is divided into four areas A1 to A4 having a uniform length in the Y direction. Each of these areas A1 to A4 is an area (memory block) in which a corresponding local bit line is formed. Because complementary signals appear in global bit lines forming a pair, noise between the bit lines is cancelled by the twist structure shown in FIG. 2. For example, when the global bit line GBLT2 is focused, the global bit line GBLT2 is adjacent to complementary bit lines GBLBi and GBLT1 in the areas A1 and A2, respectively, and is adjacent to complementary bit lines GBLB3 and GBLT3 in the areas A3 and A4, respectively. Therefore, regardless of a logic level of data appearing in the global bit liens GBLT1 and GBLBi and the global bit lines GBLT3 and GBLB3, noise given to the adjacent global bit line GBLT2 is cancelled.

Figure 3:
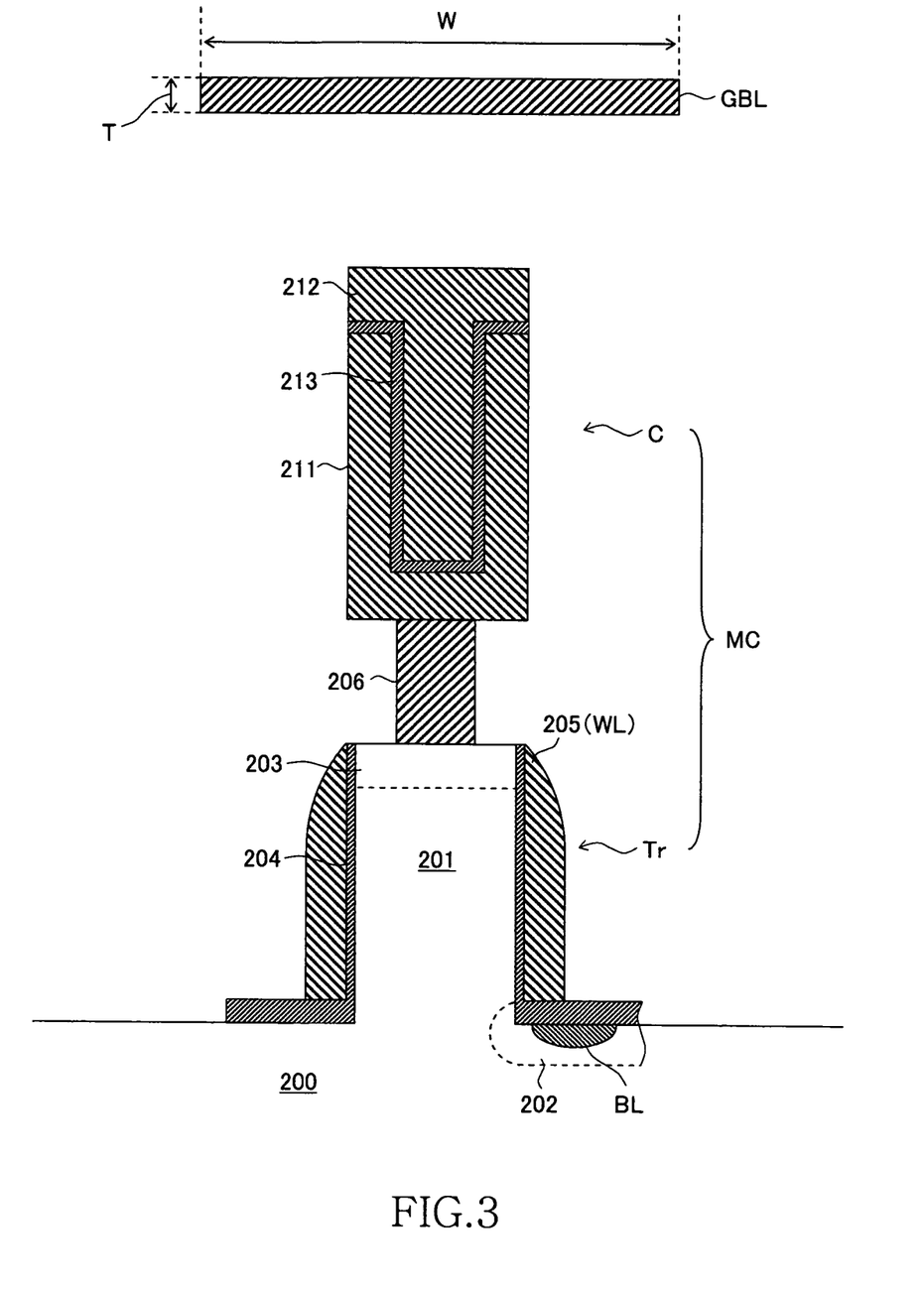
FIG. 3 is a cross-sectional view showing a physical structure of a memory cell MC.

FIG. 3 is a cross-sectional view showing a physical structure of the memory cell MC.

As shown in FIG. 3, in the first embodiment, the memory cell MC is configured by a series circuit of a cell transistor Tr (access transistor) and a cell capacitor C (memory element), as an example. The cell transistor Tr is a pillar MOS transistor (vertical transistor) having a pillar channel 201 perpendicular to a main surface of a semiconductor substrate 200. Diffusion layers 202 (local bit line BL) and 203 (at a storage contact side of the memory cell MC) are provided respectively at a lower side and an upper side of the pillar channel 201. A side surface is covered with a gate electrode 205 via a gate dielectric film 204. Accordingly, when a predetermined voltage is applied to the gate electrode 205, the upper and lower diffusion layers 202 and 203 are electrically connected. The gate electrode 205 functions as the word line WL. Based on this configuration, one memory cell MC can be formed in an area of $4F^2$ (F is a minimum feature size). A $4F^2$ memory cell MC is a one-intersection and one-cell type having memory cells arranged at all intersections of the word lines WL and local bit lines BL.

The lower diffusion layer 202 is connected to the local bit lines BL embedded in the semiconductor substrate 200. As explained above, in the first embodiment, the local bit lines BL are embedded in the semiconductor substrate 200. Therefore, there are few cross couplings of the local bit lines BL and the word lines WL as compared with those when a normal planar transistor is used. The local bit line BL can be formed by using doped polycrystalline silicon such as arsenic (As), tungsten, or a metal material.

The upper diffusion layer 203 (at the storage contact side of the memory cell MC) is connected to a lower electrode 211 of the cell capacitor C via a contact plug 206. The cell capacitor C is configured by the lower electrode 211, an upper electrode 212, and a capacitance dielectric film 213 provided between the lower electrode 211 and the upper electrode 212. The upper electrode 212 is connected to a predetermined fixed potential. A global bit line GBL is provided above the cell capacitor C. Because an upper-layer wiring is used for the global bit line GBL, a film thickness T of the wiring becomes large. Copper (Cu) of a low electric resistance can be used for a material of the global bit line GBL. Accordingly, a wiring resistance (a specific resistance per unit length) of the global bit line GBL can be sufficiently smaller than that of the local bit line BL (for example, 1/10 or lower).

When a wiring resistance of the global bit line GBL is designed to be sufficiently smaller than the wiring resistance of the local bit line BL, the length of the global bit line GBL can be increased while suppressing the length of a local bit line BL. Accordingly, substantially a uniform access time (a time from when the word line WL is activated until when the sense amplifier SAi is activated) can be achieved regardless of a position of a memory cell in the Y direction. Consequently, the number of the local bit lines BL allocated to one global bit line GBL can be increased corresponding to a necessary memory capacitance. As a result, the number of memory cells allocated to one sense amplifier can be increased. In the first embodiment, although four local bit lines BL are allocated to one global bit line GBL, 16 or 32 local bit lines BL can be also allocated. When a conductive resistance (ON resistance) of a hierarchical switch is higher than a parasitic resistance of the global bit line GBL, a time constant (CR) of the ON resistance and the local bit line BL dominates a distribution multiplier.

The configuration of the semiconductor device according to the first embodiment is as described above. An operation of the semiconductor device is explained below.

Figure 4:
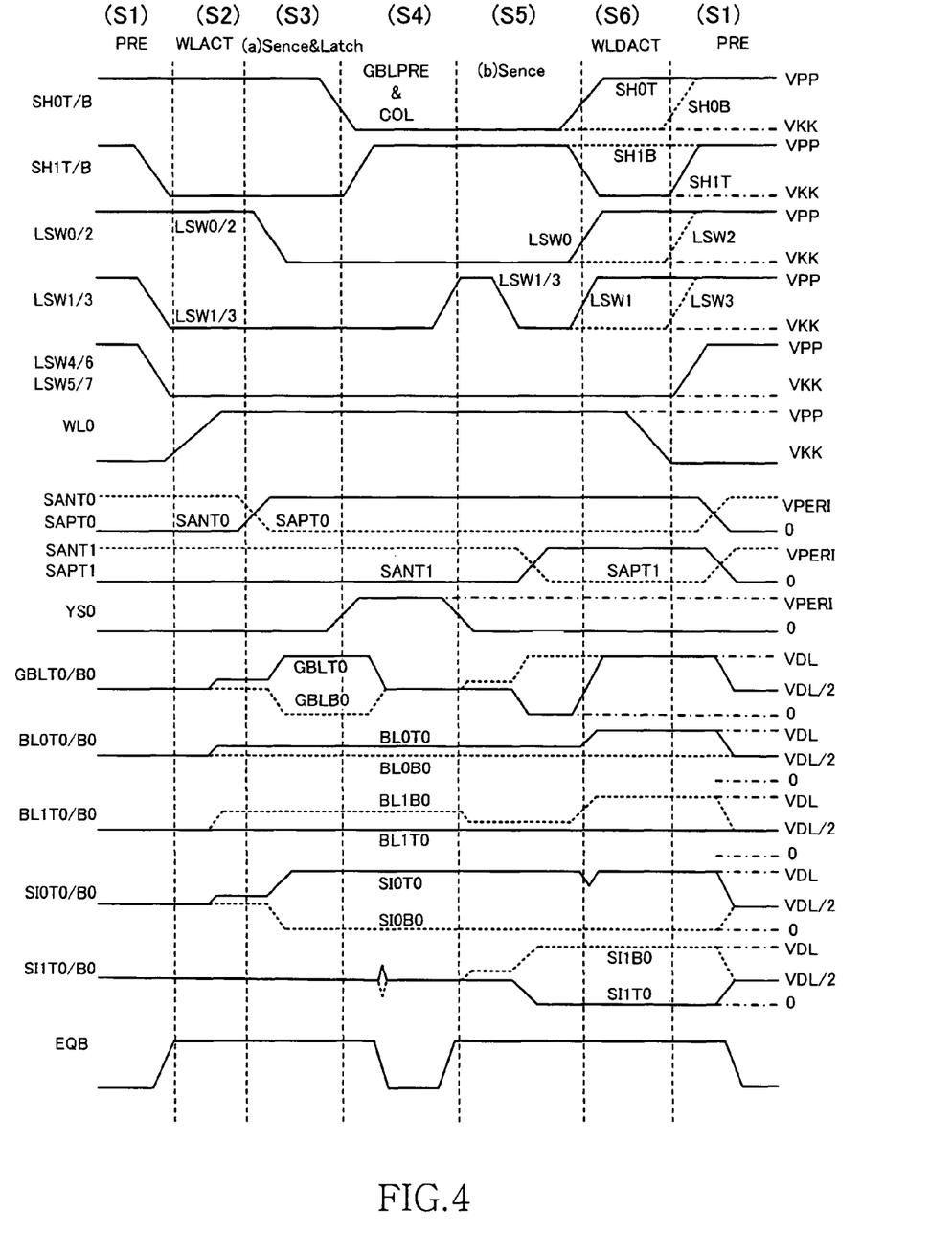
FIG. 4 is a timing chart for explaining an operation at a read time of the semiconductor device 10.

FIG. 4 is a timing chart for explaining an operation at a read time of the semiconductor device 10 according to the first embodiment. As shown in FIG. 4, the read operation of the semiconductor device 10 is performed at six steps.

A first step (S1) is a precharge operation. The connection signals SH0T, SH0B, SH1T, SH1B, and LSW0 to LSW7 are all activated at high level, and the equalize signal EQB is activated at low level. Accordingly, all global bit lines and all local bit lines are precharged at a predetermined potential (VDL/2) by the equalize circuit EQ.

A second step (S2) is a step of selecting the word line WL. A predetermined word line WL is activated based on a row address. In an example shown in FIG. 4, the word line WL0 shown in FIG. 1 is activated. Based on this, memory cells MC(a) and MC(b) are simultaneously connected to local bit lines BL0T0 and BL1B0, respectively. In response to the activation of the word line WL0, the connection signals SH1T, SH1B, LSW1, and LSW3 to LSW7 excluding the connection signals SH0T, SH0B, LSW0, and LSW2 are changed to low level. Accordingly, global bit lines GBLT0 and GBLB0 and a sense amplifier SA0A are interrupted, and all hierarchical switches excluding hierarchical switches LSW0T0 and LSW1B0 are in a nonconductive state. As a result, a potential of the local bit line BL0T0 changes based on a logic level of data held in the memory cell MC(a), and a potential of the local bit line BL1B0 changes based on a logic level of data held in the memory cell MC(b). The example shown in FIG. 4 is a case that data of high level are held in the memory cells MC (a) and MC (b). In this case, the potential of the local bit lines BL0T0 and BL1B0 is slightly increased.

Because the local bit line BL0T0 is connected to the global bit line GBLT0 via the hierarchical switch LSW0T0, the potential of the global bit line GBLT0 is also slightly increased.

On the other hand, the local bit line BL1B0 is not connected to the global bit line GBLB0 at this time because a corresponding hierarchical switch LSW1B0 is in a nonconductive state. The global bit line GBLB0 is connected to the local bit line BL0B0 via the hierarchical switch LSW0B0. However, because a memory cell connected to the local bit line BL0B0 is not selected, the potential of the global bit line GBLB0 does not change. The hierarchical switch LSW0B0 is kept conductive to match CR models of the global bit lines GBLT0 and GBLB0 at a sense time, thereby obtaining a high sensitivity. It is not essential to set the hierarchical switch LSW0B0 conductive so long as it is possible to sense.

By the above operation, a potential difference based on read data from the memory cell MC(a) appears in one input/output node SI0T0 and the other input/output node SI0B0 of the sense amplifier SA0. That is, data held in the memory cell MC(a) is transferred to the sense amplifier SA0.

A third step (S3) is a step of activating the sense amplifier SA0. Specifically, sense switches SSW20 and SSW30 and all hierarchical switches are set in a nonconductive state by inactivating the connection signals SH1T, SH1B, and LSW0 to LSW7 at low level. The sense amplifier SA0 is activated in this state. The sense amplifier SA0 is activated by setting a sense activation signal SAPT0 at high level and by setting a sense activation signal SANT0 at low level. Accordingly, a potential difference appearing in the input/output nodes SI0T0 and SI0B0 of the sense amplifier SA0 is amplified by the sense amplifier SA0. Amplified read data is held in the sense amplifier SA0.

A fourth step (S4) is a step of precharging (equalizing) the global bit lines GBLT0 and GBLB0 at a predetermined potential (VDL/2) again by the equalize circuit EQ. During this period, a column selection signal YS0 is activated, thereby transferring read data held in the sense amplifier SA0, that is, data read from the memory cell MC(a), to the local I/O line LIO. The connection signals SH0T and SH0B are set at low level, and the connection signals SH1T and SH1B are set at high level, thereby changing over sense switches SSW00 and SSW10 to a nonconductive state and changing over the sense switches SSW20 and SSW30 to a conductive state.

A fifth step (S5) is a step of transferring data of the memory cell MC(b) to the sense amplifier SAGA and activation of the sense amplifier SAGA. Specifically, by setting the connection signals LSW1 and LSW3 at high level, the local bit line BL1B0 is connected to the global bit line GBLB0, and the potential of the global bit line GBLB0 is changed corresponding to data read from the memory cell MC(b). On the other hand, although a local bit line BL1T0 is connected to the local bit line BL1T0 via a hierarchical switch LSW1T0, a memory cell connected to the local bit line BL1T0 is not selected. Therefore, the potential of the global bit line GBLT0 does not change. In this case, it is not essential to set the hierarchical switch LSW1T0 conductive so long as it is possible to sense.

By the above operation, a potential difference based on read data from the memory cell MC(b) appears in one input/output node SI1T0 and the other input/output node SI1B0 of the sense amplifier SA0A. That is, data held in the memory cell MC(b) is transferred to the sense amplifier SA0A.

Next, by inactivating the connection signals LSW1 and LSW3 at low level, all hierarchical switches are set in a nonconductive state, and the sense amplifier SA0A is activated in this state. The sense amplifier SA0A is activated by setting a sense activation signal SAPT1 at high level and by setting a sense activation signal SANT1 at low level. As a result, a potential difference appearing in the input/output nodes SI1T0 and SI1B0 is amplified by the sense amplifier SA0A. The amplified read data is held in the sense amplifier SA0A. While the sense amplifier SA0A is performing a sense operation, read data transferred to the local I/O line LIO is output to outside of the semiconductor device 10.

A sixth step (S6) is a step of restoring data read from the memory cells MC(a) and MC(b) into the memory cells MC(a) and MC(b). Specifically, by setting the selection signals SH0T, SH1B, LSW0, and LSW1 at high level and by setting the selection signals SH0B, SH1T, and LSW0 to LSW7 at low level, sense switches SWW0 and SWW3 and the hierarchical switches LSW0T0 and LSW1B0 are electrically conducted. Accordingly, data amplified by the sense amplifiers SA0 and SA0A are simultaneously restored into the memory cells MC (a) and MC (b), respectively. Thereafter, the word line WL0 is inactivated, thereby completing a series of read operations.

After completing a series of read operations, the process returns to the first step (S1), and the global bit lines and the local bit lines are precharged.

In the above example, a read operation and a restore operation are performed for the memory cell MC(b) although data read from the memory cell MC (b) is not readout to outside. This is because data held in the memory cell MC(b) is unavoidably destroyed following an access to the memory cell MC(a). Therefore, contrary to the above example, when the memory cell MC(b) is accessed, it suffices that data of the memory cell MC(a) is sensed by the sense amplifier SA0A, and data of the memory cell MC (b) is sensed by the sense amplifier SA0.

As explained above, in the read operation of the semiconductor device 10 according to the first embodiment, data of selected two memory cell are amplified by time division by using two sense amplifiers connected to a pair of global bit lines. Consequently, it is not necessary to provide switches in the middle of the global bit lines as required in the case of Japanese Patent Application Laid-open No. 2000-114491 and Japanese Patent Application Laid-open No. H11-163292.

Accordingly, the parasitic capacitance of the global bit lines can be reduced. Further, because the operation condition of the sense amplifier SAi and that of the sense amplifier SAiA become equal, a sufficient operation margin of the sense amplifiers can be secured. Because restore operations are performed simultaneously, unlike Japanese Patent Application Laid-open No. H8-87880, problems accompanying with restore operations by time division do not happen.

Because data amplified by the sense amplifier SA0 can be output to outside while the sense amplifier SA0A is performing a sense operation, an access time is not delayed.

A second embodiment of the present invention is explained next.

Figure 5:
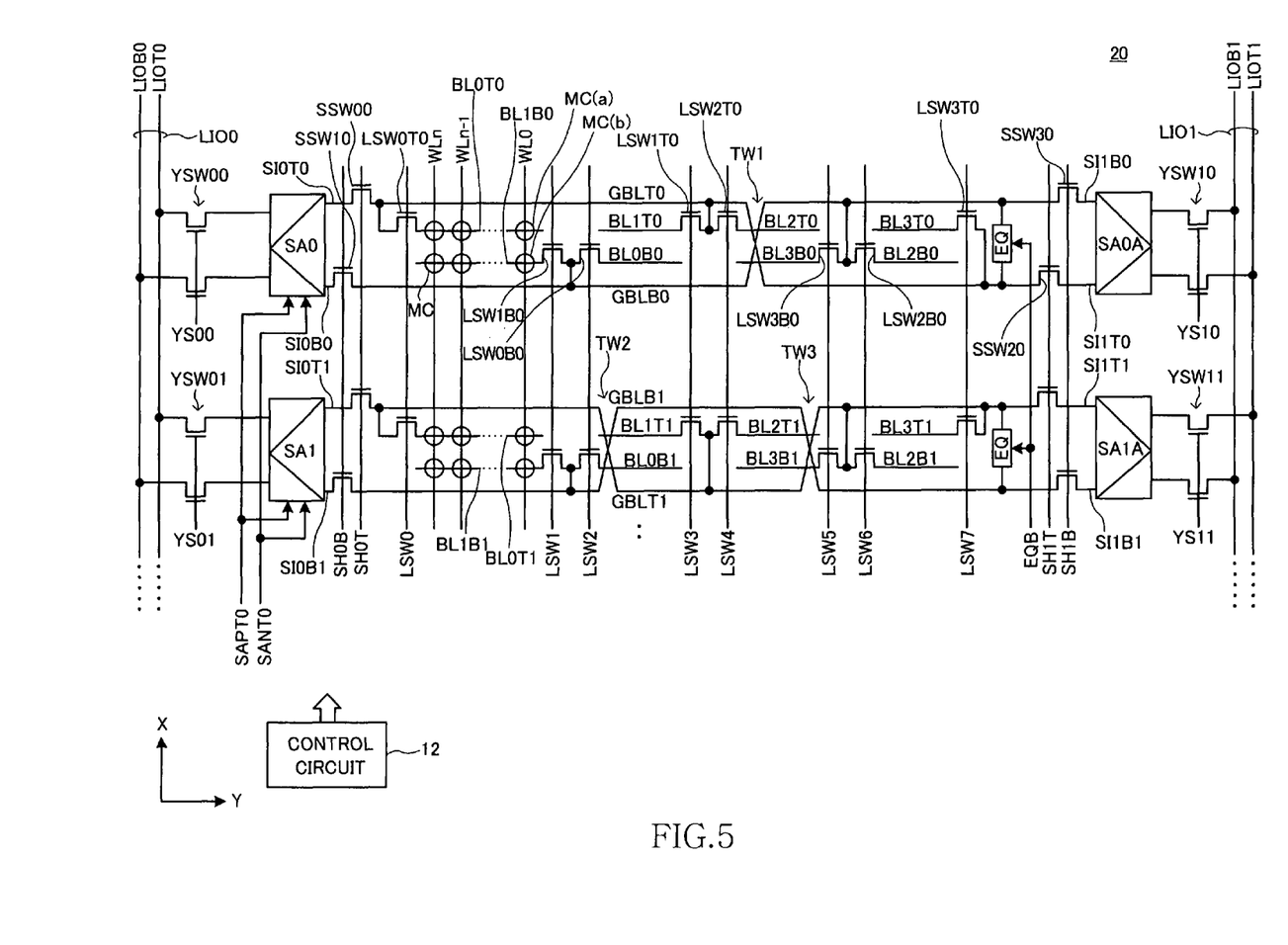
FIG. 5 is a circuit configuration showing a main part of a semiconductor device 20 according to a second embodiment of the present invention.

FIG. 5 is a circuit configuration showing a main part of a semiconductor device 20 according to the second embodiment.

As shown in FIG. 5, the semiconductor device 20 according to the second embodiment is different from the semiconductor device 10 according to the first embodiment in that a local I/O line LIO0 is allocated to the sense amplifier SAi, and a local I/O line LIO1 is allocated to the sense amplifier SAiA. Because other features of the semiconductor device 20 are identical to those of the semiconductor device 10, like elements are denoted by like reference numerals and redundant explanations thereof will be omitted.

The local I/O line LIO0 is a complementary wiring including local I/O lines LIOT0 and LIOB0. When a column switch YSW0i is in a conductive state, data of the global bit line GBLTi amplified by the sense amplifier SAi is supplied to the local I/O line LIOT0, and data of the global bit line GBLBi amplified by the sense amplifier SAi is supplied to the local I/O line LIOB0. Similarly, the local I/O line LIO1 is a complementary wiring including local I/O lines LIOT1 and LIOB1. When a column switch YSW1i is in a conductive state, data of the global bit line GBLTi amplified by the sense amplifier SAiA is supplied to the local I/O line LIOT1, and data of the global bit line GBLBi amplified by the sense amplifier SAiA is supplied to the local I/O line LIOB1. The column switches YSW0i and YSW1i are configured by an N-channel MOS transistor, and corresponding column selection signals YS0i and YS1i are supplied respectively to gate electrodes of the column switches YSW0i and YSW1i.

Figure 6:
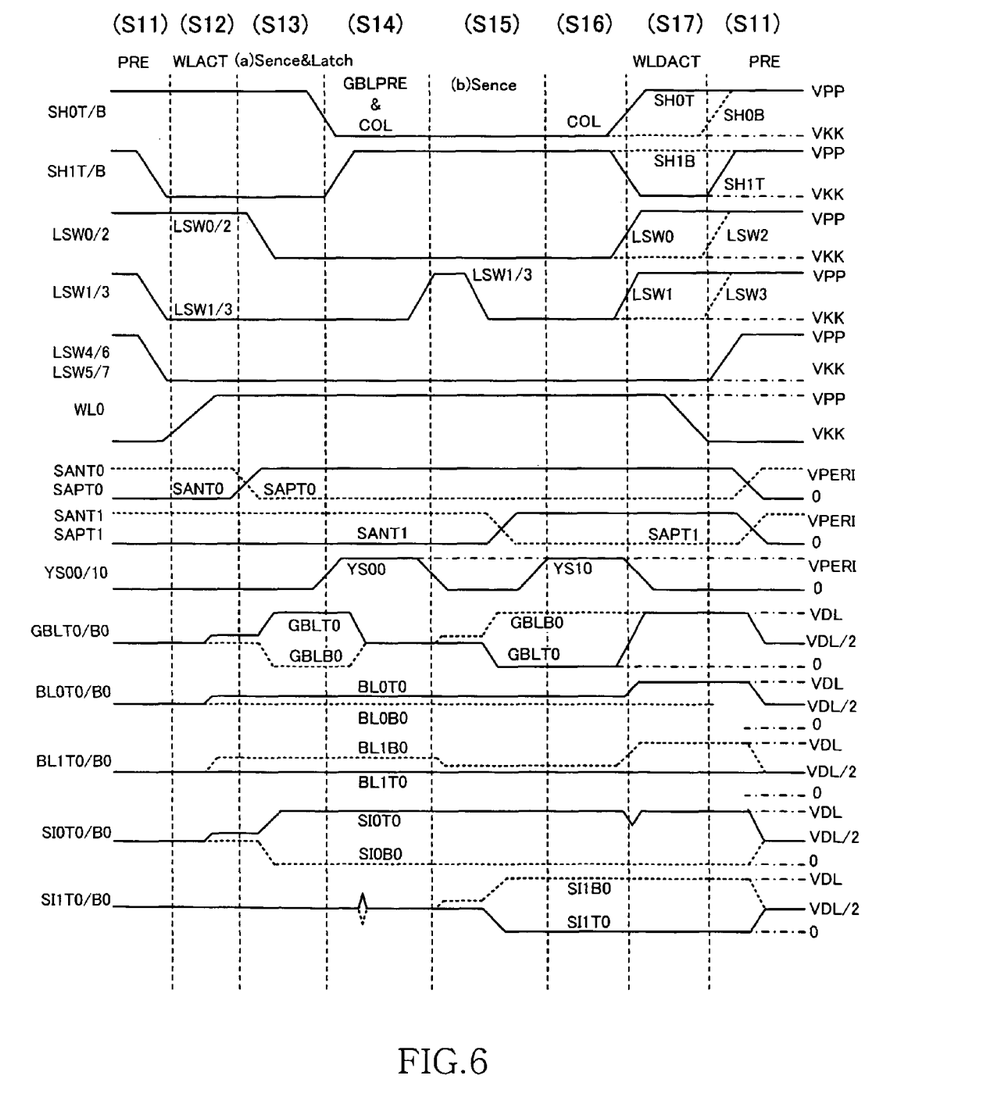
FIG. 6 is a timing chart for explaining an operation at a read time of the semiconductor device 20.

FIG. 6 is a timing chart for explaining an operation at a read time of the semiconductor device 20 according to the second embodiment. As shown in FIG. 6, the read operation of the semiconductor device 20 is performed at seven steps.

Operations at a first step (S11) to a fifth step (S15) are the same as those of the first step (S1) to the fifth step (S5) shown in FIG. 4, and thus redundant explanations thereof will be omitted.

A sixth step (S16) is a step of outputting data amplified by the sense amplifier SA0A to the local I/O line LIO1. That is, the column selection signal YS10 is activated, thereby transferring read data held in the sense amplifier SA0A, that is, data read from the memory cell MC(b) is transferred to the local I/O line LIO1.

An operation at a seventh step (S17) is the same as that of the sixth step (S6) shown in FIG. 4, and thus redundant explanations thereof will be omitted.

After completing a series of read operations, the process returns to the first step (S11) again, and the global bit lines and the local bit lines are precharged.

As explained above, in the semiconductor device 20 according to the second embodiment, the local I/O lines LIO0 and LIO1 are respectively allocated to two sense amplifiers SAi and SAiA connected to the pair of global bit lines GBLTi and GBLBi. Therefore, data of the two memory cells MC(a) and MC(b) to be accessed can be output to outside. Because the data of the memory cells MC(a) and MC(b) are transferred to the local I/O lines LIO0 and LIO0 at different timings, the data transferred to the I/O line LIO0 can be output to outside while the sense amplifier SAiA is performing a sense operation, and thereafter the data amplified by the sense amplifier SAiA can be output to outside continuously.

It is apparent that the present invention is not limited to the above embodiments, but may be modified and changed without departing from the scope and spirit of the invention.

Therefore, the basic technical concept of the present specification is not limited to that explained above, and circuit formats of the sense amplifiers and switches are not limited to those explained in the above embodiments. Further, an equalize voltage of bit lines is not limited to a so-called ½ voltage (VDL/2), and can be a low voltage at a VSS side and a high voltage at a VARY side, for example. Further, the present invention may be applied to various kinds of FETs (Field Effect Transistors) such as MISs (Metal-Insulator Semiconductors) and TFTs (Thin Film Transistors), other than MOSs (Metal Oxide Semiconductors). The present invention may be applied to various kinds of FETs such as transistors. The transistors may partially include bipolar transistors.

The basic technical concept of the present invention can be applied not only to an exclusive storage device, but to various types of semiconductor devices. For example, the present invention can be applied to semiconductor devices in general, such as a CPU (Central Processing Unit), an MCU (Micro Control Unit), a DSP (Digital Signal Processor), an ASIC (Application Specific Integrated Circuit), or an ASSP (Application Specific Standard Circuit), which has an information storage function. For example, an SOC (System on Chip), an MCP (Multi Chip Package), and a POP (Package on Package) can be mentioned as product formats of such a semiconductor device to which the present invention is applied. The present invention is applicable to semiconductor devices with the above arbitrary product format or package format.

Also, NMOS transistors (n-channel MOS transistors) are typical examples of the transistors of the first conductivity type, and PMOS transistors (p-channel MOS transistors) are typical examples of the transistors of the second conductivity type.

Various combinations and selections of the components disclosed herein may be made within the scope of the invention. In other words, the present invention of course includes various changes and modifications that are obvious to those skilled in the art according to all the disclosure including the claims and the technical concept.

What is claimed is:

1. A semiconductor device comprising:
    first and second global bit lines;
    a plurality of first local bit lines respectively connected to the first global bit line via first hierarchical switches;
    a plurality of second local bit lines respectively connected to the second global bit line via second hierarchical switches;
    a plurality of first memory cells allocated to each of the first local bit lines;
    a plurality of second memory cells allocated to each of the second local bit lines;
    a plurality of word lines that connect the first and second memory cells to corresponding first and second local bit lines, respectively;
    a first sense amplifier connected to the first and second global bit lines via first and second sense switches, respectively;

a second sense amplifier connected to the first and second global bit lines via third and fourth sense switches, respectively; and a control circuit, wherein the control circuit activates one of the word lines to simultaneously connect selected ones of the first and second memory cells to corresponding first and second local bit lines, the control circuit brings one of the first hierarchical switches and the first and second sense switches into an electrically conductive state, said one of the first hierarchical switches being provided between the corresponding first local bit line connected to the selected first memory cell and the first global bit line, thereby transferring data stored in the selected first memory cell to the first sense amplifier, the control circuit brings the first hierarchical switch into an electrically nonconductive state, and thereafter activates the first sense amplifier, thereby amplifying data stored in the selected first memory cell, the control circuit brings one of the second hierarchical switches and the third and fourth sense switches into an electrically conductive state, said one of the second hierarchical switches being provided between the corresponding second local bit line connected to the selected second memory cell and the second global bit line, thereby transferring data stored in the selected second memory cell to the second sense amplifier, the control circuit brings the second hierarchical switch into an electrically nonconductive state, and thereafter activates the second sense amplifier, thereby amplifying data stored in the selected second memory cell, and the control circuit brings the first and fourth sense switches and the first and second hierarchical switches into an electrically conductive state, and also brings the second and third sense switches into an electrically nonconductive state, thereby simultaneously restoring data amplified by the first and second sense amplifiers into the selected first and second memory cells, respectively.

2. The semiconductor device as claimed in claim 1, further comprising an equalize circuit that equalizes the first and second global bit lines at a predetermined potential, wherein the control circuit activates the equalize circuit after bringing the first hierarchical switch into an electrically nonconductive state and before transferring data stored in the second memory cell to the second sense amplifier, thereby equalizing the first and second global bit lines at the predetermined potential.

3. The semiconductor device as claimed in claim 1, wherein the control circuit brings another one of the second hierarchical switches provided between another one of the second local bit lines not connected to the selected second memory cell and the second global bit line into an electrically conductive state at a time of transferring data stored in the selected first memory cell to the first sense amplifier, and the control circuit brings another one of the first hierarchical switches provided between another one of the first local bit lines not connected to the selected first memory cell and the first global bit line into an electrically conductive state at a time of transferring data stored in the selected second memory cell to the second sense amplifier.

4. The semiconductor device as claimed in claim 1, wherein the control circuit outputs data amplified by the first sense amplifier to outside while activating the second sense amplifier.

5. The semiconductor device as claimed in claim 1, wherein the control circuit outputs data amplified by the second sense amplifier to outside after outputting data amplified by the first sense amplifier to outside.

6. The semiconductor device as claimed in claim 1, wherein the first and second global bit lines are extended in a first direction, and have twist parts in which positions in a second direction intersecting the first direction are switched with each other.

7. The semiconductor device as claimed in claim 1, wherein the first and second sense switches are connected to one ends of the first and second global bit lines, respectively and the third and fourth sense switches are connected to other ends of the first and second global bit lines, respectively.

8. A semiconductor device comprising:

first and second global bit lines each formed continuously;

first to fourth sense switches;

a first sense amplifier connected to one ends of the first and second global bit lines via the first and second sense switches, respectively;

a second sense amplifier connected to other ends of the first and second global bit lines via the third and fourth sense switches, respectively;

a plurality of first local bit lines;

a plurality of first hierarchical switches each connecting an associated one of the first local bit lines to the first global bit line without an intervention of anyone of the first and third sense switches;

a plurality of second local bit lines;

a plurality of second hierarchical switches each connecting an associated one of the second local bit lines to the second global bit line without an intervention of anyone of the second and fourth sense switches;

a plurality of first memory cells respectively allocated to the first local bit lines;

a plurality of second memory cells respectively allocated to the second local bit lines;

a plurality of word lines, each of the plurality of word lines being connected in common to an associated one of the first memory cells and an associated one of the second memory cells; and a control circuit that controls at least the first to fourth sense switches mutually independently.

9. The semiconductor device as claimed in claim 8, wherein the control circuit performs mutually different controls of the first to fourth sense switches in a first control of transferring data from the first and second global bit lines to the first sense amplifier, a second control of transferring data from the first and second global bit lines to the second sense amplifier, and a third control of transferring data from the first and second sense amplifiers to the first and second global bit lines.

10. The semiconductor device as claimed in claim 9, wherein the first and second controls are performed in time-sharing to time series, the third control includes a fourth control of transferring data from the first sense amplifier to one of the first and second global bit lines, and a fifth control of transferring data from the second sense amplifier to other one of the first and second global bit lines, and the fourth and fifth controls are performed simultaneously.

11. The semiconductor device as claimed in claim 9, wherein
the control circuit brings both the first and second sense switches into an electrically conductive state while keeping both the third and fourth sense switches in an electrically nonconductive state at a time of transferring data from the first and second global bit lines to the first sense amplifier, and
the control circuit brings both the third and fourth sense switches into an electrically conductive state while keeping both the first and second sense switches in an electrically nonconductive state at a time of transferring data from the first and second global bit lines to the second sense amplifier.

12. The semiconductor device as claimed in claim 9, wherein, at a time of transferring data from the first and second sense amplifiers to the first and second global bit lines, the control circuit brings both the first and fourth sense switches into an electrically conductive state while keeping both the second and third sense switches in an electrically nonconductive state, or brings both the second and third sense switches into an electrically conductive state while keeping both the first and fourth sense switches in an electrically nonconductive state.

13. The semiconductor device as claimed in claim 10, wherein
the control circuit brings both the first and second sense switches into an electrically conductive state while keeping both the third and fourth sense switches in an electrically nonconductive state at a time of transferring data from the first and second global bit lines to the first sense amplifier, and
the control circuit brings both the third and fourth sense switches into an electrically conductive state while keeping both the first and second sense switches in an electrically nonconductive state at a time of transferring data from the first and second global bit lines to the second sense amplifier.

14. The semiconductor device as claimed in claim 10, wherein, at a time of transferring data from the first and second sense amplifiers to the first and second global bit lines, the control circuit brings both the first and fourth sense switches into an electrically conductive state while keeping both the second and third sense switches in an electrically nonconductive state, or brings both the second and third sense switches into an electrically conductive state while keeping both the first and fourth sense switches in an electrically nonconductive state.

15. The semiconductor device as claimed in claim 8, wherein
the control circuit brings both the first and second sense switches into an electrically conductive state while keeping both the third and fourth sense switches in an electrically nonconductive state at a time of transferring data from the first and second global bit lines to the first sense amplifier, and
the control circuit brings both the third and fourth sense switches into an electrically conductive state while keeping both the first and second sense switches in an electrically nonconductive state at a time of transferring data from the first and second global bit lines to the second sense amplifier.

16. The semiconductor device as claimed in claim 15, wherein, at a time of transferring data from the first and second sense amplifiers to the first and second global bit lines, the control circuit brings both the first and fourth sense switches into an electrically conductive state while keeping both the second and third sense switches in an electrically nonconductive state, or brings both the second and third sense switches into an electrically conductive state while keeping both the first and fourth sense switches in an electrically nonconductive state.

17. The semiconductor device as claimed in claim 8, wherein, at a time of transferring data from the first and second sense amplifiers to the first and second global bit lines, the control circuit brings both the first and fourth sense switches into an electrically conductive state while keeping both the second and third sense switches in an electrically nonconductive state, or brings both the second and third sense switches into an electrically conductive state while keeping both the first and fourth sense switches in an electrically nonconductive state.

18. A semiconductor device comprising:
a first sense amplifier including first and second sense nodes;
a second sense amplifier including third and fourth sense nodes;
a first global bit line including a first continuous portion defined by first and second ends;
a second global line including a second continuous portion defined by third and fourth ends;
a first switch connected between the first sense node of the first sense amplifier and the first end of the first global bit line;
a second switch connected between the second sense node of the first sense amplifier and the third end of the second global bit line;
a third switch connected between the third sense node of the second sense amplifier and the second end of the first global bit line;
a fourth switch connected between the fourth sense node of the second sense amplifiers the fourth end of second global bit line;
first, second, third and fourth local bit lines;
a fifth switch connecting the first local bit line to the first continuous portion of the first global bit line without an intervention of anyone of the first and third switches;
a sixth switch connecting the second local bit line to the first continuous portion of the first global bit line without an intervention of anyone of the first and third switches;
a seventh switch connecting the third local bit line to the second continuous portion of the second global bit line without an intervention of anyone of the second and fourth switches;
an eighth switch connecting the fourth local bit line to the second continuous portion of the second global bit line without an intervention of anyone of the second and fourth switches;
a plurality of first word lines each intersecting the first and third local bit lines;
a plurality of second word lines each intersecting the second and fourth local bit lines;
a plurality of first memory cells each connected to the first local bit line and an associated one of the first word lines;
a plurality of second memory cells each connected to the second local bit line and an associated one of the second word lines;
a plurality of third memory cells each connected to the third local bit line and an associated one of the first word lines; and
a plurality of fourth memory cells each connected to the fourth bit line and an associated one of the second word lines.

19. The device as claimed in claim 18, wherein the first and second global bit lines twist at least once between the first and second sense amplifiers.

20. The device as claimed in claim 18, wherein the first and second global bit lines twist at least twice between the first and second sense amplifiers.

* * * * *